United States Patent
Shanbhag et al.

(10) Patent No.: US 11,798,948 B2
(45) Date of Patent: Oct. 24, 2023

(54) SEMICONDUCTOR STRUCTURE WITH SHARED WELL

(71) Applicant: GLOBALFOUNDRIES U.S. Inc., Malta, NY (US)

(72) Inventors: Kaustubh Shanbhag, Slingerlands, NY (US); Eric S. Kozarsky, Ballston Spa, NY (US); George R. Mulfinger, Wilton, NY (US); Jianwei Peng, Clifton Park, NY (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 0 days.

(21) Appl. No.: 17/496,296

(22) Filed: Oct. 7, 2021

(65) Prior Publication Data

US 2023/0112377 A1    Apr. 13, 2023

(51) Int. Cl.
*H01L 27/12* (2006.01)
*H01L 21/84* (2006.01)
*H01L 21/762* (2006.01)
*H01L 29/808* (2006.01)

(52) U.S. Cl.
CPC ...... *H01L 27/1203* (2013.01); *H01L 21/7624* (2013.01); *H01L 21/84* (2013.01); *H01L 29/808* (2013.01)

(58) Field of Classification Search
CPC ... H01L 27/1203; H01L 21/84; H01L 21/775; H01L 27/12; H01L 29/78675; H01L 27/0922

USPC ............................................ 257/66; 438/149
See application file for complete search history.

(56) References Cited

U.S. PATENT DOCUMENTS

| | | |
|---|---|---|
| 6,667,226 B2 | 12/2003 | Pinto et al. |
| 6,864,151 B2 | 3/2005 | Yan et al. |
| 8,502,308 B2 | 8/2013 | Schrems et al. |
| 2015/0076564 A1* | 3/2015 | Singh et al. ...... H01L 27/11807 257/206 |
| 2019/0267377 A1* | 8/2019 | Ng et al. ............. H01L 27/0922 |

OTHER PUBLICATIONS

Grenouillet et al., "UTBB FDSOI transistors with dual STI for a multi-Vt strategy at 20nm node and below", IEEE, 2012, 4 pages.
Grenouillet et al., "UTBB FDSOI scaling enablers for the 10nm node", IEEE, 2013, 2 pages.

* cited by examiner

*Primary Examiner* — Thinh T Nguyen
(74) *Attorney, Agent, or Firm* — Anthony Canale; Andrew M. Calderon; Calderon Safran & Cole P.C.

(57) ABSTRACT

The present disclosure relates to semiconductor structures and, more particularly, to semiconductor devices with a shared common backside well and methods of manufacture. The structure includes: adjacent gate structures over a semiconductor substrate; a common well in the semiconductor substrate under the adjacent gate structures; a deep trench isolation structure extending through the common well between the adjacent gate structures; and a shared diffusion region between the adjacent gate structures.

12 Claims, 6 Drawing Sheets

SEMICONDUCTOR STRUCTURE WITH SHARED WELL

FIELD OF THE INVENTION

The present disclosure relates to semiconductor structures and, more particularly, to semiconductor devices with a shared common backside well and methods of manufacture.

BACKGROUND

Transistors may be used in many different applications including, for example, mobile devices. In mobile devices, the transistors may be radio frequency (RF) devices. The radio frequency devices can be fabricated using semiconductor fabrication processes, known as CMOS processes.

Radio frequency devices can be fabricated on separate islands, e.g., wells, within a semiconductor substrate. These devices have the advantage of being independently controlled through a back gate bias. The disadvantage of such a layout, though, is that these independent islands require valuable area on the chip, itself. These layouts may also exhibit high wiring resistance. On the other hand, multiple devices built on a single island will use less space on the chip, but then there is the inability to independently control back gate bias of multiple devices, e.g., radio frequency blocks.

SUMMARY

In an aspect of the disclosure, a structure comprises: adjacent gate structures over a semiconductor substrate; a common well in the semiconductor substrate under the adjacent gate structures; a deep trench isolation structure extending through the common well between the adjacent gate structures; and a shared diffusion region between the adjacent gate structures.

In an aspect of the disclosure, a structure comprises: a substrate; a well structure formed in the substrate; adjacent gate structures over the substrate and sharing the well structure; a deep trench isolation structure extending at least to a same level of the well structure in the substrate; an amorphous material on the deep trench isolation structure; and a raised diffusion region overlapping the amorphous material and the substrate between the adjacent gate structures.

In an aspect of the disclosure, a method comprises: forming adjacent gate structures over a semiconductor substrate; forming a common well in the semiconductor substrate under the adjacent gate structures; forming a deep trench isolation structure extending through the common well between the adjacent gate structures; and forming a shared diffusion region between the adjacent gate structures.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to semiconductor devices with a shared common backside well and methods of manufacture. More specifically, the semiconductor structures comprise fully-depleted semiconductor-on-insulator (FDSOI) based semiconductor structures with a shared common backside well and deep trench isolation structures embedded under the semiconductor (e.g., Si) film. In embodiments, the semiconductor structures may be multiple radio frequency (RF) devices which have the shared common backside well. Advantageously, by implementing the shared common backside well and deep trench isolation structures, it is now possible to independently control back gate bias of multiple RF blocks on a same diffusion in FDSOI technology.

In more specific embodiments, the semiconductor structures comprise multi-finger FDSOI MOSFETs on a single diffusion with a common backside well. The deep trench isolation structures, e.g., deep fence, may be provided under an active region which has a similar depth as the deep trench isolation structures. In embodiments, the deep trench isolation structures isolate the backside well between adjacent devices (e.g., RF devices) or RF blocks. The top surface of the deep trench isolation structures may be aligned with the top surface of the buried insulator film (e.g., buried oxide) of the FDSOI. Alternatively, the top surface of the deep trench isolation structures may be between the top and bottom surfaces of the buried insulator film (e.g., buried oxide) of the FDSOI. A semiconductor film may be grown on top of the deep trench isolation structures with a thickness of a FDSOI silicon film. The shared common backside well and deep trench isolation structures allow, for example, (i) independent transistor tuning of a same diffusion using a back gate biasing (negate effect of mismatch and stress) and (ii) bias tuning for a common gate independently of common source, hence providing higher efficiency and gain.

The semiconductor devices of the present disclosure can be manufactured in a number of ways using a number of different tools. In general, though, the methodologies and tools are used to form structures with dimensions in the micrometer and nanometer scale. The methodologies, i.e., technologies, employed to manufacture the semiconductor devices of the present disclosure have been adopted from integrated circuit (IC) technology. For example, the structures are built on wafers and are realized in films of material patterned by photolithographic processes on the top of a wafer. In particular, the fabrication of the semiconductor devices uses three basic building blocks: (i) deposition of thin films of material on a substrate, (ii) applying a patterned mask on top of the films by photolithographic imaging, and (iii) etching the films selectively to the mask.

Figure 1:
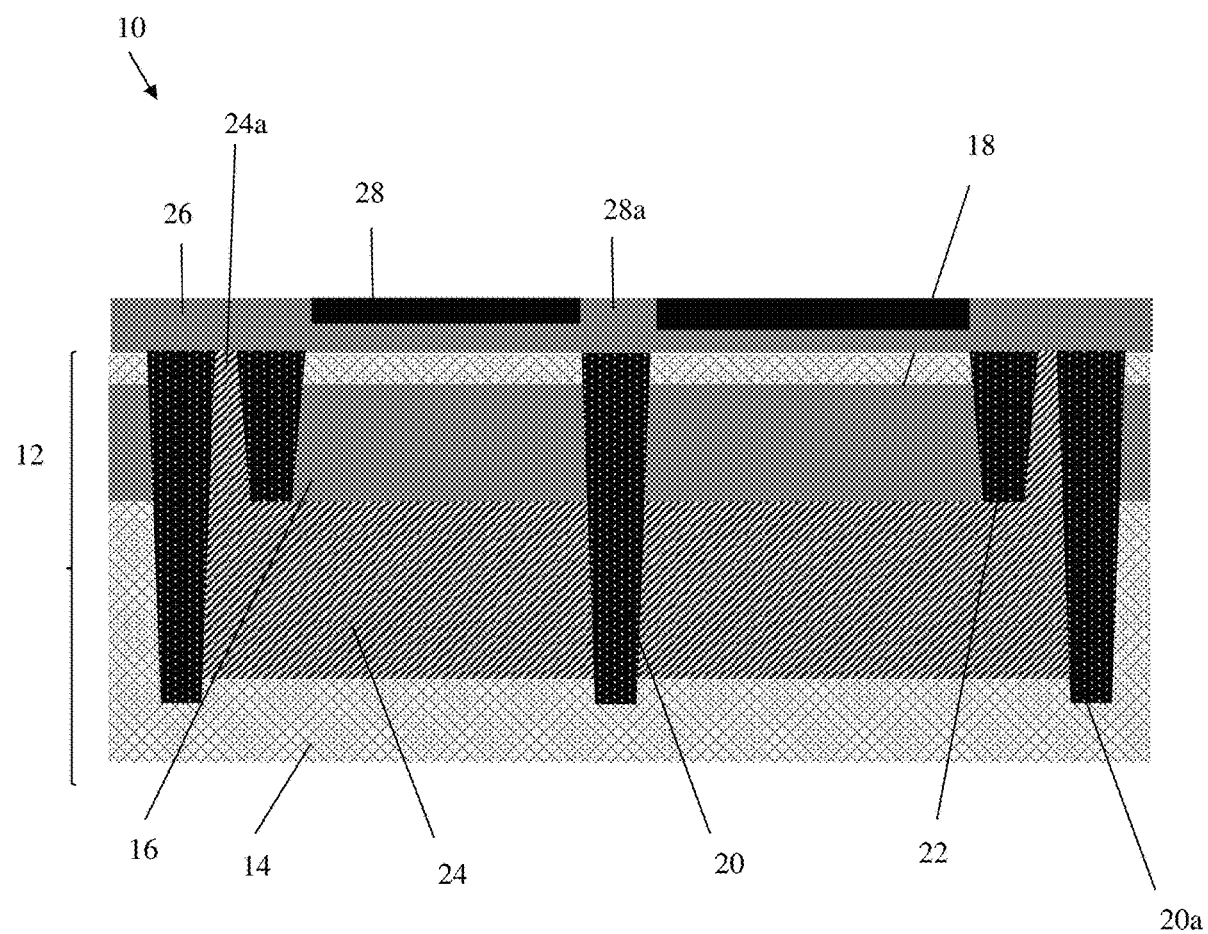
FIG. 1 shows a structure with a common backside well, amongst other features, and respective fabrication processes in accordance with aspects of the present disclosure.

FIG. 1 shows a structure with a common backside well, amongst other features, and respective fabrication processes in accordance with aspects of the present disclosure. More specifically, the structure 10 of FIG. 1 includes a substrate 12. In embodiments, the substrate is a fully-depleted semiconductor-on-insulator (FDSOI).

The substrate 12 includes a handle wafer 14, a buried insulator layer 16 and a semiconductor layer 18. In embodiments, the handle wafer 14 and semiconductor layer 18 may comprise any suitable semiconductor material including, but not limited to, Si, SiGe, SiGeC, SiC, GaAs, InAs, InP, and other III/V or II/VI compound semiconductors. In more specific embodiments, the handle wafer 14 and the top semiconductor layer 18 comprise a single crystalline semiconductor material, such as, for example, single crystalline silicon. The insulator layer 16 comprises any suitable material, including silicon oxide, sapphire, other suitable insulating materials, and/or combinations thereof. An exemplary insulator layer 16 may be a buried oxide layer (BOX). The insulator layer 16 may be formed by any suitable process, such as separation by implantation of oxygen (SIMOX), oxidation, deposition, and/or other suitable process.

Still referring to FIG. 1, deep trench isolation structures 20 and shallow trench isolation structures 22 are formed in the substrate 12. In embodiments, the deep trench isolation structures 20 may extend into the handle substrate 14; whereas the shallow trench isolation structures 22 may extend to the insulator layer 16. The deep trench isolation structures 20 and shallow trench isolation structures 22 may be formed in separate processes using conventional lithography, etching and deposition processes.

More specifically, for example, a resist formed over the semiconductor layer 18 is exposed to energy (light) to form a pattern (opening). An etching process with a selective chemistry, e.g., reactive ion etching (RIE), will be used to transfer the pattern from the resist to the substrate 12 to form one or more trenches in the substrate 12 through the openings of the resist. The trenches will be of different depths for the deep trench isolation structures 20 and the shallow trench isolation structures 22. Following the resist removal by a conventional oxygen ashing process or other known stripants, insulator material can be deposited into the trenches by any conventional deposition processes, e.g., chemical vapor deposition (CVD) processes. Any residual insulator material on the surface of the semiconductor layer 18 can be removed by conventional chemical mechanical polishing (CMP) processes.

FIG. 1 further shows a common backside well 24 in the substrate 12. In embodiments, the common backside well 24 may be a p-well. The p-well may be doped with p-type dopants, e.g., Boron (B). The well 24 may also be an all-around p-well 24 with contacts 24a for both common source (CS) and common gate (CG) stages of a CASCODE.

The well 24 may be formed by introducing a dopant by, for example, ion implantation in the substrate 12. In embodiments, a patterned implantation mask may be used to define selected areas exposed for the implantation. The implantation mask may include a layer of a light-sensitive material, such as an organic photoresist, applied by a spin coating process, pre-baked, exposed to light projected through a photomask, baked after exposure, and developed with a chemical developer. The implantation mask has a thickness and stopping power sufficient to block masked areas against receiving a dose of the implanted ions.

The deep trench isolation structures 20, 20a are preferably at a same level or deeper into the substrate 12 than the well 24 in order to provide isolation between devices formed on the active region. In embodiments, the deep trench isolation structures 20a may isolate the well 24 from the substrate 12, e.g., forming a single island. On the other hand, the deep trench isolation structure 20 may be provided in the well 24, itself, and may be used to isolate active regions of adjacent gate structures (see FIG. 6).

FIG. 1 further shows an interlevel dielectric material 26 and etch stop layers 28 provided over the semiconductor layer 18. In embodiments, the etch stop layers 28 may be nitride material with a space 28a therebetween. In embodiments, the space 28a is approximately the dimension, e.g., width, of the deep trench isolation structure 20 that extends through the common backside well 24 in order to isolate yet to be formed gate structures. The interlevel dielectric material 26 and etch stop layers 28 may be formed by conventional deposition and patterning processes such that no further explanation is required herein for a complete understanding of the present disclosure.

Figure 2:
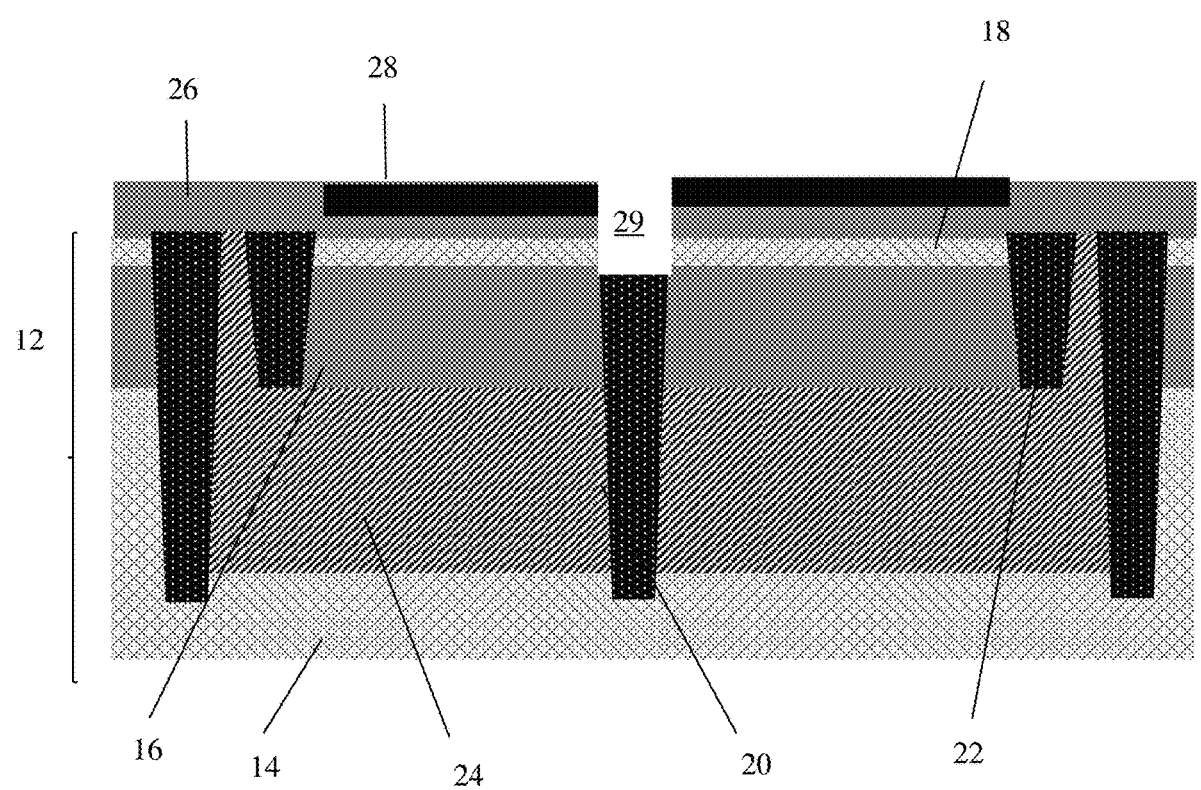
FIG. 2 shows an opening and recessed deep trench isolation structure, amongst other features, and respective fabrication processes in accordance with aspects of the present disclosure.

FIG. 2 shows an opening 29 between the etch stop layers 28, which opens to the deep trench isolation structure 20. In embodiments, the opening 29 is provided by a dry etching process which may also be used to recess the deep trench isolation structure 20 below a top surface of the semiconductor layer 18. The etching process can be used provided by a conventional lithography photomask process, e.g., a patterned etch photomask which corresponds with the opening between the etch stop layers 28. In embodiments, the deep trench isolation structure 20 may be recessed to a top surface of the insulator layer 16 or between a top surface and a bottom surface of the insulator layer 16. In embodiments, the opening 29 can be about 40 nm to 60 nm wide; although other dimensions are also contemplated herein.

Figure 3:
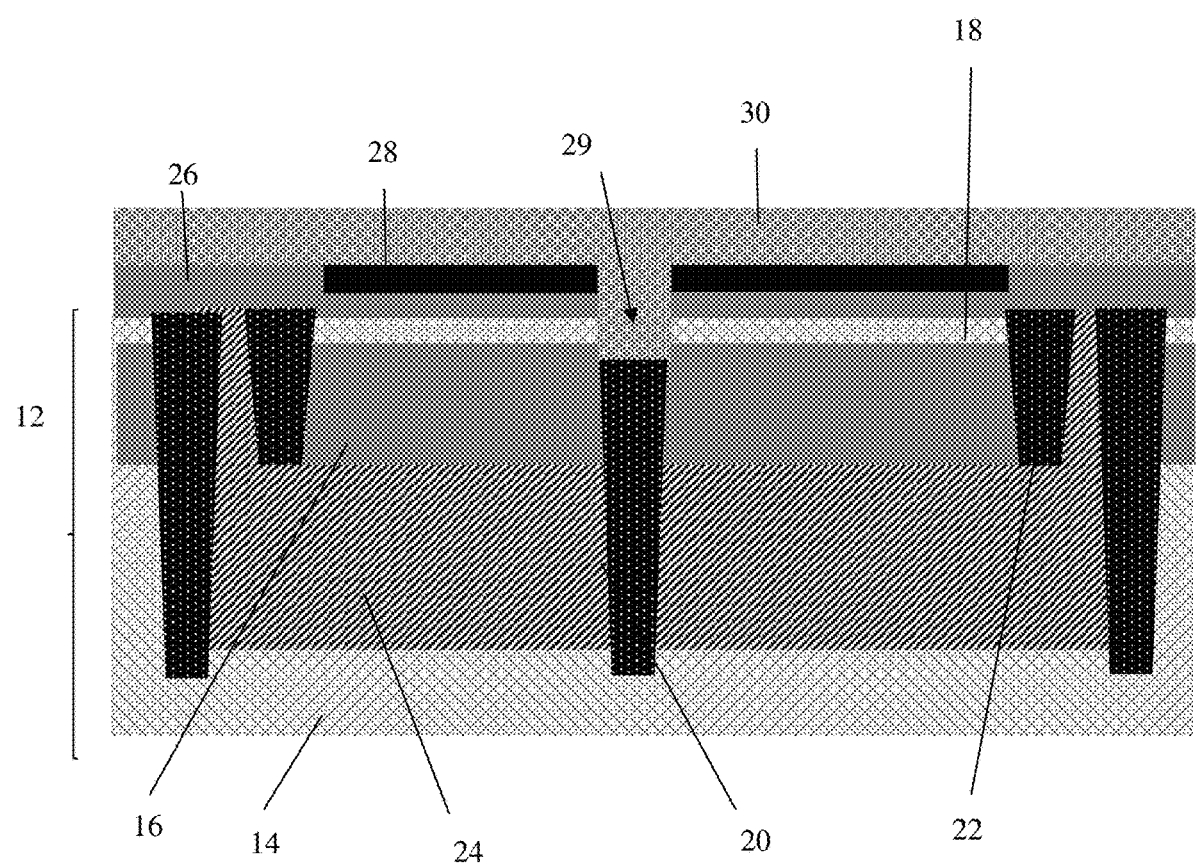
FIG. 3 shows a semiconductor material within the opening, amongst other features, and respective fabrication processes in accordance with aspects of the present disclosure.

In FIG. 3, a semiconductor material 30 may be grown within the opening 29 and over the recessed deep trench isolation structure 20. In embodiments, the growth process may also cover the interlevel dielectric material 26 and etch stop layers 28. In embodiments, the semiconductor material 30 is amorphous Si which is annealed to form polysilicon material.

Figure 4:
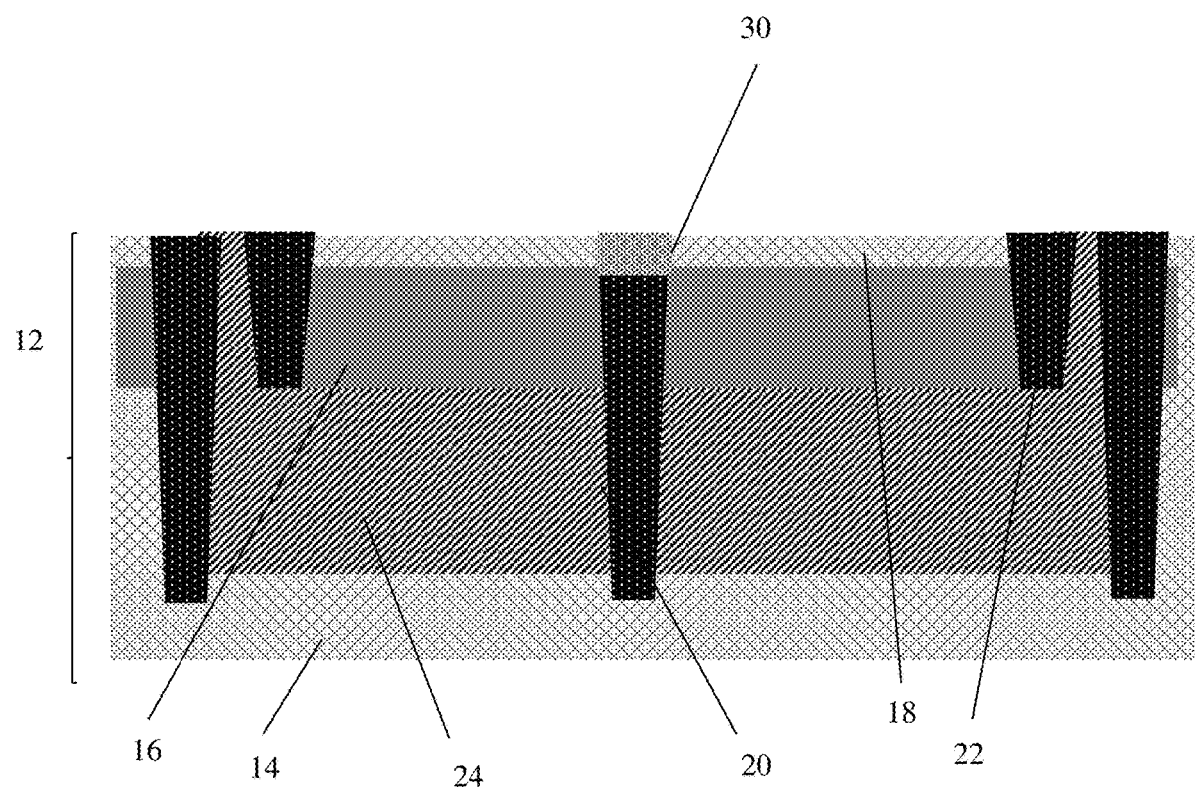
FIG. 4 shows a recessing of the semiconductor material, amongst other features, and respective fabrication processes in accordance with aspects of the present disclosure.

As shown in FIG. 4, any excess polysilicon material 30 on top of the interlevel dielectric material 26 and etch stop layers 28 may be removed using a dry etching process. The dry etching process may also recess the polysilicon material 30 to a level of the semiconductor layer 18. In this way, the top surface of the polysilicon material 30 within the deep trench isolation structure 20 may be planar with the top surface of the semiconductor layer 18. In embodiments, the amorphous silicon 30 formed on an upper surface of the deep trench isolation structures 20 may couple respective active regions under adjacent gates.

The interlevel dielectric material 26 and etch stop layers 28 may also be removed by conventional etching or planarization processes. The exposed surface of the semiconductor layer 18 can also undergo a conventional pre-cleaning process to remove any residual interlevel dielectric material (e.g., oxide).

Figure 5:
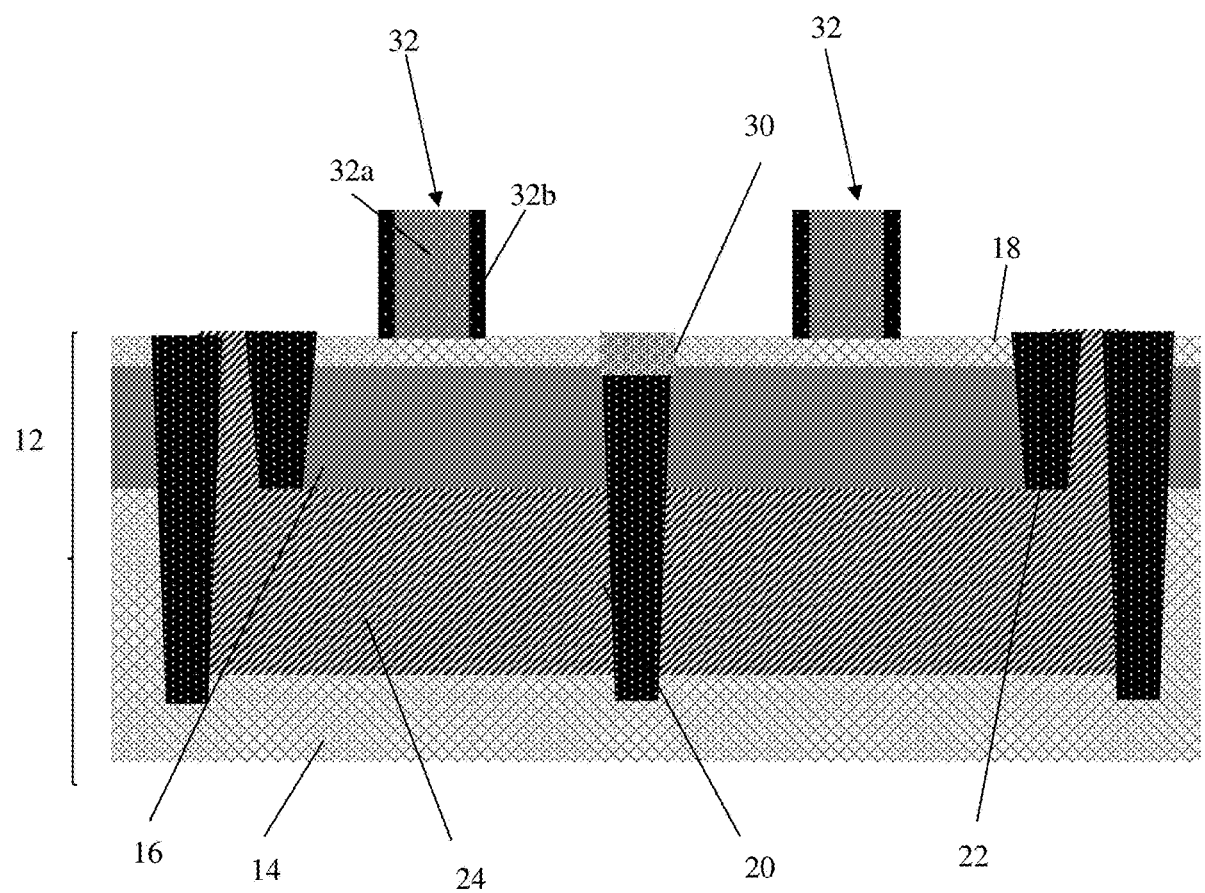
FIG. 5 shows gate structures with a common backside well, amongst other features, and respective fabrication processes in accordance with aspects of the present disclosure.

In FIG. 5, gate structures 32 are formed on the semiconductor layer 18 on opposing sides of the deep trench isolation structure 20. The gate structures 32 will share the same common backside well 24. The gate structures 32 may be formed by a gate first process or replacement gate process. The gate structures 32 may be multiple finger gate structures.

In the gate first process, for example, gate material 32a, e.g., gate dielectric material and metal workfunction material, is deposited on the semiconductor layer 18, followed by a patterning process, e.g., lithography and etching processes.

In embodiments, the gate dielectric material can be a high-k gate dielectric material, e.g., $HfO_2$, $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof. The metal workfunction material can be, e.g., Ti, TiAlC, Al, TiAl, TaN, TaAlC, TiN, TiC, Co, HfTi, TiSi, TaSi or combinations thereof. The metal workfunction materials and gate dielectric material may be formed by CVD, physical vapor deposition (PVD) including sputtering, atomic layer deposition (ALD) or other suitable deposition processes. Sidewall spacers 32b may be formed on sidewalls of the patterned gate structures 32. The sidewall spacers 32b may be formed by any known deposition process, followed by an anisotropic etching process.

Figure 6:
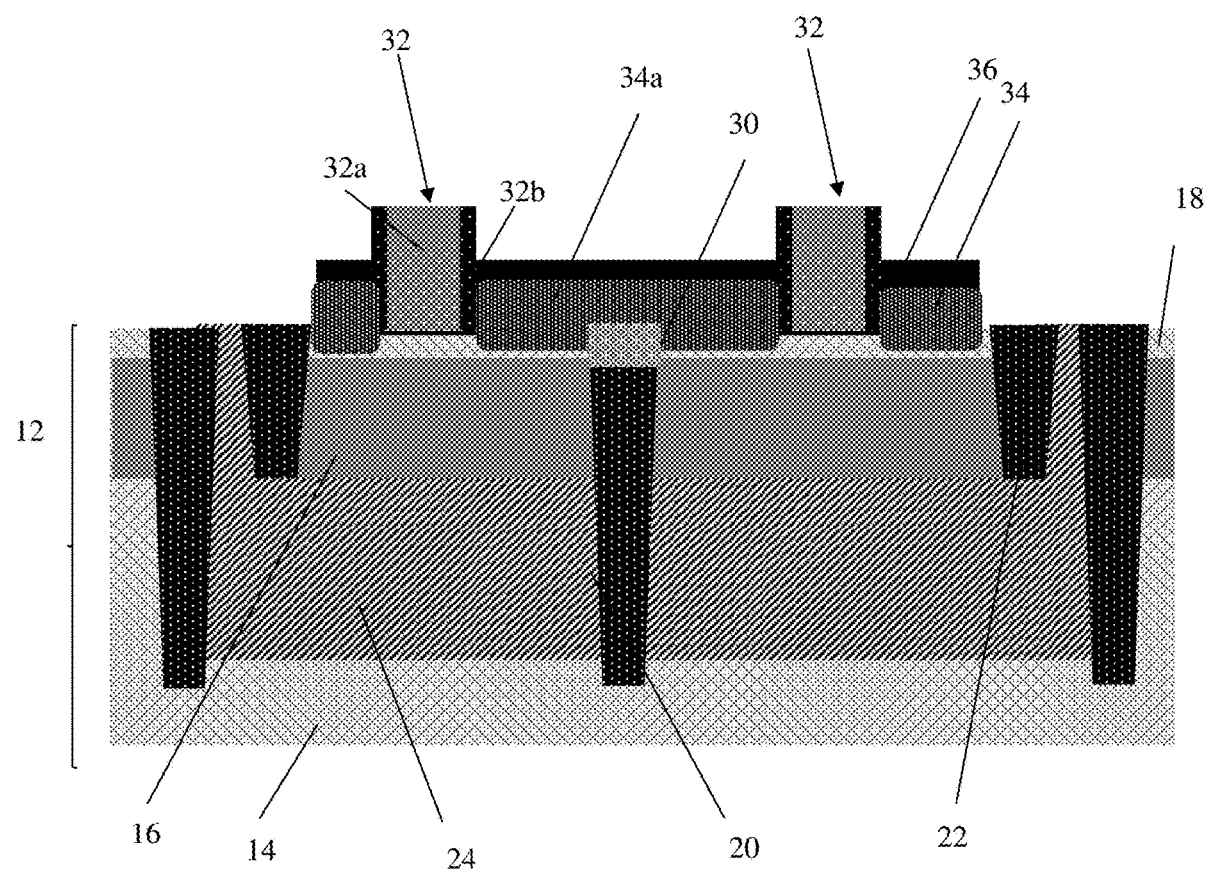
FIG. 6 shows raised diffusion regions, amongst other features, and respective fabrication processes in accordance with aspects of the present disclosure.

FIG. 6 shows raised diffusion regions 34, 34a e.g., source and drain regions. The adjacent gate structures 32 may share a raised diffusion region 34a located over the polysilicon material 30. In embodiments, the raised diffusion regions 34, 34a may be formed by an epitaxial growth process by selectively growing a semiconductor material on the exposed semiconductor layer 18 and polysilicon material 30. For example, the raised diffusion regions 34a may overlap both the semiconductor layer 18 and polysilicon material 30 to ensure standard junction overlap under the gate structures 32.

In accordance with exemplary embodiments, the raised diffusion regions 34, 34a may include Si or SiGe or other III-V compound semiconductor materials. Depending on whether the resulting device, e.g., FET, is a p-type or n-type, a p-type or an n-type impurity may be in-situ doped. After the epitaxy step, epitaxy regions may be further implanted with a p-type or an n-type impurity to form source and drain regions. In accordance with alternative embodiments of the present disclosure, the implantation step may be skipped when epitaxy regions are in-situ doped with the p-type or n-type impurity during the epitaxy. In either scenario, the dopant will diffuse into the both the semiconductor layer 18 and polysilicon material 30. Also, additional lightly doped implants may be employed for junction profile tuning.

It should also be understood that the raised diffusion regions 34, 34a may undergo a silicide process to form silicide contacts 36. The silicide process begins with deposition of a thin transition metal layer, e.g., nickel, cobalt or titanium, over fully formed and patterned semiconductor devices (e.g., doped or ion implanted source and drain regions 34, 34a). After deposition of the material, the structure is heated allowing the transition metal to react with exposed silicon (or other semiconductor material as described herein) in the active regions of the semiconductor device (e.g., source and drain regions) forming a low-resistance transition metal silicide. Following the reaction, any remaining transition metal is removed by chemical etching, leaving silicide contacts in the active regions of the device. It should be understood by those of skill in the art that silicide contacts will not be required on metal gate structures. Further back end of the line (BEOL) processes can be performed including metallization processes known to those of skill in the art such that no further explanation is required for a complete understanding of the present disclosure.

The semiconductor devices can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   adjacent gate structures over a semiconductor substrate;
   a common well in the semiconductor substrate under the adjacent gate structures;
   a deep trench isolation structure extending through the common well between the adjacent gate structures; and
   a shared diffusion region between the adjacent gate structures.

2. The structure of claim 1, wherein the semiconductor substrate comprises a semiconductor-on-insulator material and the common well is under insulator material of the semiconductor-on-insulator material.

3. The structure of claim 2, wherein the deep trench isolation structure comprises a recess to a surface of the insulator material.

4. The structure of claim 3, further comprising amorphous semiconductor material on a surface of the recessed deep trench isolation structure.

5. The structure of claim 4, wherein the shared diffusion region comprises a raised source/drain region comprising a single crystal semiconductor material or polysilicon material.

6. The structure of claim 4, wherein the amorphous semiconductor material comprises polysilicon material.

7. The structure of claim 4, wherein the amorphous semiconductor material comprises a top surface planar with a top surface of the semiconductor substrate.

8. The structure of claim 4, wherein the shared diffusion region overlaps the amorphous semiconductor material and the semiconductor substrate between the adjacent gate structures.

9. The structure of claim 2, wherein the semiconductor-on-insulator material comprises fully depleted silicon-on-insulator material.

10. The structure of claim 2, wherein the common well is shared between the adjacent gate structures and comprises a backside p-well, and the deep trench isolation structure isolates active regions of the adjacent gate structures.

11. The structure of claim 10, wherein the shared diffusion region comprises a raised epitaxial semiconductor material that overlaps polysilicon material and the semiconductor substrate.

12. The structure in claim 2, wherein the deep trench isolation structure comprises a recess with a depth between top and bottom surfaces of the insulator.

* * * * *